United States Patent [19]
Lee et al.

[11] Patent Number: 6,013,946
[45] Date of Patent: Jan. 11, 2000

[54] WIRE BOND PACKAGES FOR SEMICONDUCTOR CHIPS AND RELATED METHODS AND ASSEMBLIES

[75] Inventors: Kyu Jin Lee; Do Soo Jeong, both of Kyungki-do; Jae June Kim, Seoul, all of Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/831,465

[22] Filed: Mar. 31, 1997

[30] Foreign Application Priority Data

Sep. 11, 1996 [KR] Rep. of Korea ..................... 96-39319

[51] Int. Cl.[7] ......................... H01L 23/06; H01L 23/495; H01L 23/02
[52] U.S. Cl. ......................... 257/684; 257/666; 257/667; 257/668; 257/691; 257/692; 257/693; 257/697; 257/773; 257/778; 257/787
[58] Field of Search .................................... 257/666, 667, 257/668, 684, 691, 692, 693, 697, 787, 778, 773

[56] References Cited

U.S. PATENT DOCUMENTS

| | | | |
|---|---|---|---|
| 4,218,701 | 8/1980 | Shirasaki | 257/778 |
| 5,148,265 | 9/1992 | Khandros et al. | 257/668 |
| 5,661,086 | 8/1997 | Nakashima et al. | 257/668 |
| 5,677,566 | 10/1997 | King et al. | 257/692 |

FOREIGN PATENT DOCUMENTS

| | | |
|---|---|---|
| 4-305962 | 10/1992 | Japan . |
| 7-245356 | 9/1995 | Japan . |
| 7-321244 | 12/1995 | Japan . |

OTHER PUBLICATIONS

Crowley et al., Chip–Size Packaging Developments, Chapter 2.15 Tessera, Inc., 1995 TechSearch International Inc., pp. 101–109.

Primary Examiner—Olik Chaudhuri
Assistant Examiner—Alonzo Chambliss
Attorney, Agent, or Firm—Myers Bigel Sibley & Sajovec

[57] ABSTRACT

A package for a semiconductor chip including a plurality of input/output pads includes an insulating layer and a plurality of conductive traces. The insulating layer has a first surface for bonding with the surface of the semiconductor chip so that the input/output pads are exposed adjacent the insulating layer. The conductive traces are provided on a second surface of the insulating layer opposite the first surface wherein each of the conductive traces corresponds to a respective one of the input/output pads. In particular, the conductive traces are adapted to receive a plurality of bonding wires each of which corresponds to a respective one of the input/output pads. Accordingly, each of the bonding wires can be bonded at a first end to the respective input/output pad and at a second end to the respective conductive trace. Furthermore, the input/output pads can be on an interior portion of the surface of the semiconductor chip, and the insulating layer can have an opening therein for exposing the input/output pads. Accordingly, a dam on the second surface of the insulating layer can be provided around the opening wherein each of the conductive traces extends from adjacent the opening under the dam to a portion of the insulating layer outside the dam. Related methods and assemblies are also discussed.

25 Claims, 9 Drawing Sheets

WIRE BOND PACKAGES FOR SEMICONDUCTOR CHIPS AND RELATED METHODS AND ASSEMBLIES

FIELD OF THE INVENTION

The present invention relates to the field of semiconductor chips and more particularly to assemblies, methods, and packages for semiconductor chips.

BACKGROUND OF THE INVENTION

As semiconductor chips have become more highly integrated and the number of input/output pads per chip has increased, the need for smaller semiconductor chip packages has also increased. Accordingly, various packaging technologies have been developed to address this need. For example, the ball grid array (BGA) package provides a relatively high surface-mount density and improved electrical performance when compared with a conventional plastic package having a leadframe.

A primary difference between a ball grid array package and a conventional plastic package is that the electrical connection between the semiconductor chip and the main board is provided by a substrate including multiple layers with circuit patterns instead of a leadframe of a plastic package. In a BGA package, the semiconductor chip is attached and electrically connected to a substrate having vias which interconnect electrically conductive traces on the top layer of the substrate where the chip is attached to terminals on the bottom layer of the substrate opposite the chip. The terminals on the bottom layer of the substrate can be provided in an array pattern so that the area occupied by the BGA package on a main board is smaller than that of a conventional plastic package with peripheral terminals.

The substrate used in the BGA package, however, may still be larger than the semiconductor chip because an area without conductive traces may be required when attaching the chip to the substrate. Further reductions in the size of a BGA package may thus be limited. In response, further size reductions for semiconductor chip packages have been provided by chip-scale packages (CSP). For example, the micro-BGA ($\mu$BGA) is a chip-scale package developed by Tessera and illustrated in FIG. 1. The micro-BGA is discussed in greater detail in the following reference: Crowley et al., "Chip Size Packaging Developments", TechSearch International, Inc., August 1995, pp. 101–109.

The Tessera micro-BGA package 50 includes a flexible circuit interposer 56 that interconnects chip (input/output) pads 52 and solder bumps 58. The flexible circuit interposer includes a polyimide dielectric layer 55 with vias 55a and copper traces 54. The flexible circuit interposer 56 rests on a silicon elastomer 53, and the silicon elastomer 53 is attached directly to the face of the chip 51. The traces 54 on the chip side of the interposer 56 are connected to the solder bumps 58 through the vias 55a. Ribbon leads 57 connect the traces 54 on the flexible circuit interposer 56 with the chip pads 52 on the chip 51. The leads 57 are bonded with the chip pads 52 using a technique similar to tape automated bonding (TAB). The bonding area is encapsulated with a silicone encapsulant 59. The reduced size and inductance of the micro-BGA package 50 facilitate its use for packaging high speed semiconductor chips.

The cost of manufacturing the micro-BGA package 50 may be relatively high as a result of the fabrication of the bumps 58 and the flexible circuit interposer 56. In addition, the alignment of the chip pads 52 with the leads 57 may be difficult when bonding the package. Furthermore, the tape automated bonding technique may be difficult to use with the micro-BGA package 50.

SUMMARY OF THE INVENTION

It is therefore an object of the present invention to provide improved chip scale packages for semiconductor chips and related methods and assemblies.

It is another object of the present invention to provide chip scale packages, methods, and assemblies with reduced inductance.

It is still another object of the present invention to provide chip scale packages, methods, and assemblies with improve reliability.

These and other objects according to the present invention are provided by packages for a semiconductor chip including a plurality of input/output pads on a surface thereof. In particular, a package according to the present invention includes an insulating layer with a first surface for bonding with the surface of the semiconductor chip so that the input/output pads are exposed adjacent the insulating layer. The package also includes a plurality of conductive traces on a second surface of the insulating layer opposite the first surface wherein each of the conductive traces corresponds to a respective one of the input/output pads. Furthermore, the conductive traces are adapted to receive a plurality of bonding wires each of which corresponds to a respective one of the input/output pads so that each of the bonding wires can be bonded at a first end to the respective input/output pad and at a second end to the respective conductive trace.

Accordingly, the chip package can be bonded with the semiconductor chip and interconnections reliably formed therebetween in a cost effective manner. This chip package facilitates the connection of a highly integrated electronic circuit having a relatively large number of inputs and outputs with a main board. In particular, this chip package can facilitate a relatively large number of inputs and outputs without significantly increasing the size of the semiconductor chip assembly.

The input/output pads are preferably on an interior portion of the surface of the semiconductor chip, and the insulating layer preferably has an opening therein for exposing these input/output pads. Accordingly, a dam can be provided on the second surface of the insulating layer around the opening wherein each of the conductive traces extends from adjacent the opening under the dam to a portion of the insulating layer outside the dam. The portions of the conductive traces inside the dam adjacent the opening can thus be used when providing the wire bond connections, and the dam provides protection for the bonding wires. More particularly, the bonding wires can be protected with an encapsulant which is contained within the opening and the dam. Alternately, a sealing lid can be provided across the dam to protect the bonding wires.

The package can also include a plurality of terminals on the insulating layer outside the dam wherein each of the terminals is electrically connected to a respective one of the conductive traces. These terminals can be used to provide a connection between the package and a main board. In particular, each of the terminals preferably extends a first predetermined distance from the insulating layer, the dam preferably extends a second predetermined distance from the insulating layer, and the first predetermined distance is preferably greater than the second predetermined distance. Accordingly, the package can be bonded with a main board using the terminals without creating any contacts between the dam and the main board.

The dam can be a rectangular dam surrounding the opening. Accordingly, any encapsulant contained therein can be prevented from flowing across undesired portions of the insulating layer before hardening. In addition, at least one tie bar can extend from the dam, and a rail can be connected to the tie bar. More particularly, the dam, the at least one tie bar, and the rail can be formed from a single layer of material. The tie bar and the rail thus facilitate the continuous production of semiconductor chip assemblies wherein each of a plurality of assemblies includes a dam connected by tie bars to a common rail. After manufacture, the individual assemblies can be separated by breaking the tie bar away from the dam. In particular, a notch on the tie bar adjacent the dam can be used to facilitate the removal.

According to an alternate aspect of the present invention, a method is provided for packaging a semiconductor chip including a plurality of input/output pads on a surface thereof. This method includes the step of forming an insulating layer including a first surface for bonding with the surface of the semiconductor chip so that the input/output pads are exposed adjacent the insulating layer. A plurality of conductive traces are formed on a second surface of the insulating layer opposite the first surface wherein each of the conductive traces corresponds to a respective one of the input/output pads. In particular, the conductive traces are adapted to receive a plurality of bonding wires each of which corresponds to a respective one of the input/output pads so that each of the bonding wires can be bonded at a first end to the respective input/output pad and at a second end to the respective conductive trace.

According to still another aspect of the present invention, a method is provided for packaging a semiconductor chip including a plurality of input/output pads on an interior portion of a surface thereof. This method includes the step of forming an insulating layer including a first surface for bonding with the surface of the semiconductor chip wherein the insulating layer has an opening therein for exposing the input/output pads. A plurality of conductive traces are formed on a second surface of the insulating layer opposite the first surface wherein each of the conductive traces corresponds to a respective one of the input/output pads. In addition, a dam is formed on the second surface of the insulating layer around the opening wherein each of the conductive traces extends from adjacent the opening under the dam to a portion of the insulating layer outside the dam.

The methods, packages, and assemblies of the present invention can thus be used to provide a semiconductor chip assembly with physical dimensions on the order of those of the semiconductor chip. Accordingly, a highly integrated semiconductor chip can be electrically and mechanically connected to a main board while occupying a relatively small surface area of the main board. The size of the package also reduces the inductance and resistance of the electrical connection with the main board thus improving the performance of the chip in terms of speed and power consumption. The wire bonds between the semiconductor chip and the package can also be cost effectively formed to provide a robust mechanical and electrical connection. Furthermore, the use of the dam can facilitate the protective encapsulation of the wire bonds.

DETAILED DESCRIPTION

Figure 1:
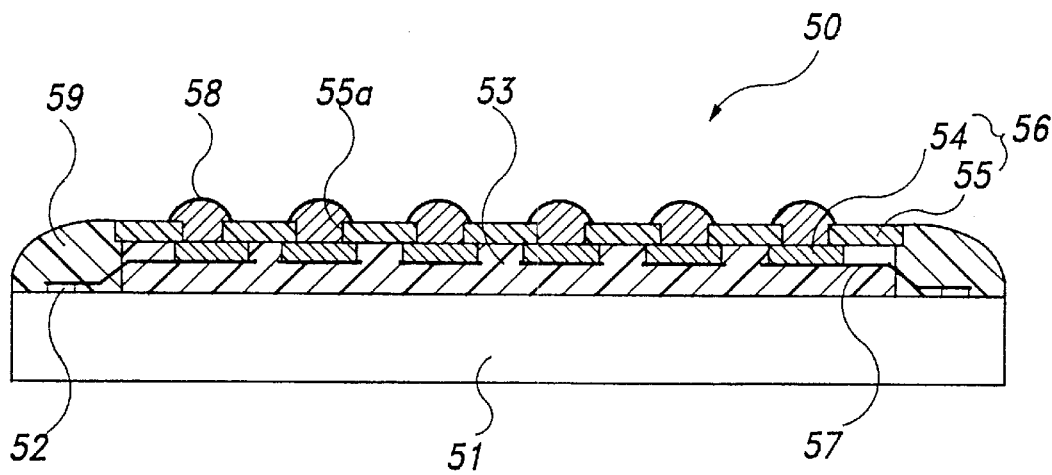
FIG. 1 is a cross-sectional view illustrating a chip package according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2:
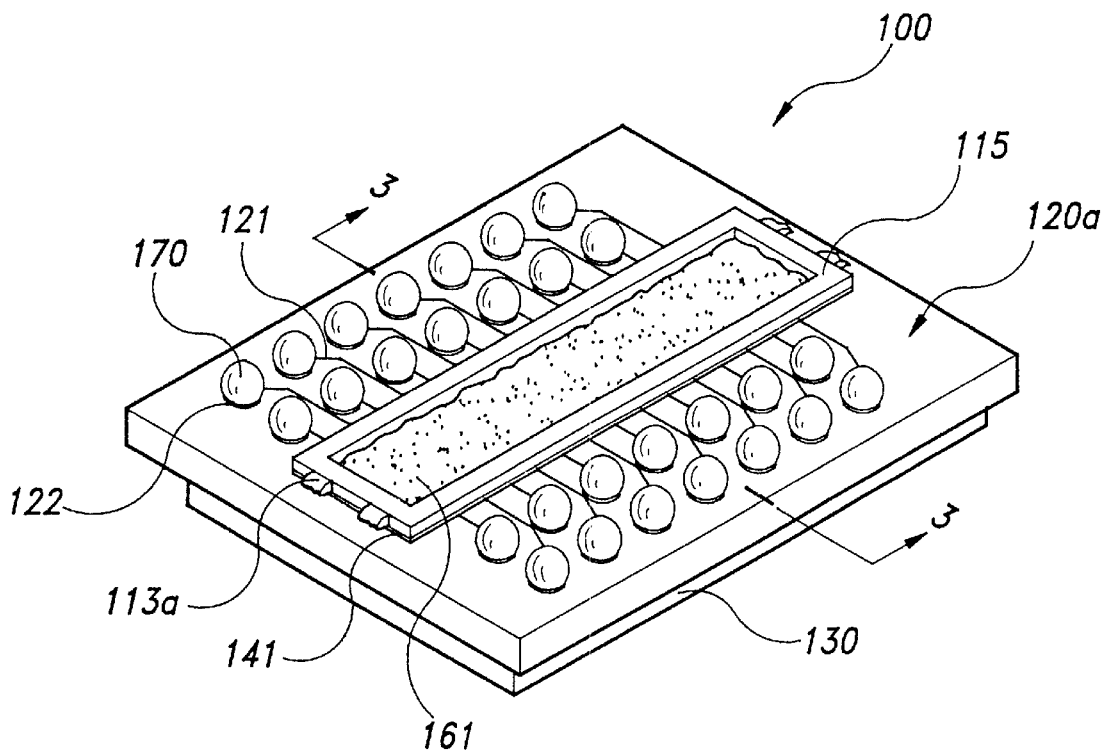
FIG. 2 is a perspective view illustrating a first semiconductor chip assembly according to the present invention.
Figure 3:
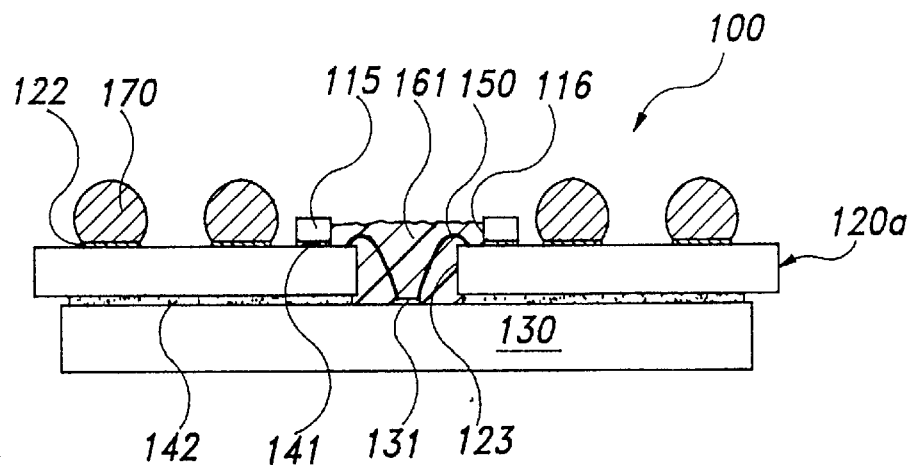
FIG. 3 is a cross-sectional view taken along section line 3—3 of FIG. 2.

FIG. 2 illustrates a chip-scale semiconductor chip assembly 100 according to the present invention, and FIG. 3 is a cross-sectional view taken along section lines 3—3 of FIG. 2. As shown, the assembly 100 includes both bonding wires 150 and terminals 170 on a surface of a circuit substrate 120a opposite a surface attached to the semiconductor chip 130. The semiconductor chip is attached to the surface of the circuit substrate 120a opposite the terminals 170 and conductive traces 121. Accordingly, the circuit substrate 120a can be reduced to a size on the order of that of the semiconductor chip. Furthermore, conventional vias are not required in the circuit substrate 120a.

The circuit substrate 120a includes a top surface, a bottom surface, and an opening 123. The conductive traces 121 and the terminals 170 are formed on the top surface of the circuit substrate 120a. The conductive traces 121 can be used to route electrical signals to and from the semiconductor chip 130, and each trace 121 has a land pad 122 for mounting the respective terminal 170. The semiconductor chip 130 is attached to the bottom surface of the circuit substrate 120a, and the opening 123 extends through a central portion of the circuit substrate 120a to expose the input/output pads 131. Although a printed circuit board (PCB) may be preferably used to provide the circuit substrate 120a of the present invention, other substrates can alternately be used. For example, the circuit substrate 120a can be a glass substrate, a ceramic substrate, or a metallic substrate.

The semiconductor chip 130 has a plurality of input/output pads 131 which are formed on a central or interior portion of the surface of the semiconductor chip 130. The semiconductor chip 130 is attached to the bottom surface of the circuit substrate 120a by a non-conductive adhesive 142. As shown, the input/output pads 131 are formed on the surface of the semiconductor chip which is affixed to the circuit substrate 120a. Accordingly, the input/output pads 131 are exposed through the opening 123 of the circuit substrate 120a.

The input/output pads 131 and the conductive traces 121 are electrically connected by bonding wires through the opening 123 of the circuit substrate 120a. In particular, a portion of each conductive trace 121 extends to a portion of the circuit substrate adjacent the opening 123 where the wire bond connection is made. In particular, bonding wires 150, such as gold (Au) or aluminum (Al) bonding wires, are used to provide the wire bond. To their knowledge, the applicants are the first to realize that a relatively small circuit substrate 120a can be attached to a semiconductor chip adjacent input/output pads and interconnections made therebetween using bonding wires. The use of the wire bond interconnections between the circuit substrate and the semiconductor chip enable the package 100 to be manufactured relatively inexpensively and easily.

A dam 115 is attached to the top surface of the circuit substrate 120a using a non-conductive adhesive 141. In particular, the dam 115 can surround the opening 123 so that each conductive trace 121 extends from the wire bonding area adjacent the opening 123 under the dam 115 to a portion of the circuit substrate outside the dam 115 where a respective landing pad 122 is located. The dam 115 may have a rectangular ring shape with a predetermined height and a predetermined width. For the purposes of discussion, the space inside the dam 115 will be referred to as a window 116, and the window 116 is preferably larger than the opening 123 of the circuit substrate 120a. The wire bonding area of each conductive trace is thus exposed through the window 116.

As will be discussed in more detail below, the dam 115 is preferably formed as an element of a strip including multiple dams, tie bars, and rails which allow the dams to be supported in a manner similar to that of a leadframe strip. The assemblies 100 can thus be continuously produced and mechanically supported during manufacture. The dam 115 also provides a structure which supports encapsulation of the bonding wires. The portion of the tie bar which remains after separating the assembly from the rails is designated by the reference number 113a of FIG. 2.

The bonding wires 150, the input/output pads 131, and the portions of the conductive traces 121 exposed by the window 116 can be encapsulated by an encapsulant 161 such as a potting resin. In particular, the encapsulant can be contained within the opening 123 and the window 116. A liquid potting resin can protect the input/output pads 131, the bonding wires 150, and the portions of the conductive traces 121 within the window 116 from environmental contaminants. The dam 115 makes it possible to control the process of potting. In particular, the dam 115 prevents the potting resin 161 from overflowing, and the dam can be used to maintain a height of the potting resin at a desired level. In other words, the dam 115 can act as an index. Because the potting resin can flow prior to setting, the dam can prevent the potting resin from flowing across undesired portions of the surface of the circuit substrate 120a. Alternately, these elements can be encapsulated with a sealing lid 162 as discussed below with regard to FIGS. 11 and 12.

The terminals 170 are formed on the land pads 122 of the circuit substrate 120a. The terminals 170 are outer electrodes of the assembly 100 which permit external electrical connections between the semiconductor chip 130 and a main board. When the terminals 170 are connected to a main board, the height of the terminals 170 may be reduced. Accordingly, the terminals 170 should have a height greater than that of the dam 115 because the dam 115 should preferably not make contact with the main board. Preferably, the terminals 170 have a height which is three times greater than that of the dam 115. For example, with 1.5 mm pitch terminals, the diameter of each terminal 170 is 0.76 mm, the height of each terminal 170 on the land pad 122 is about 0.6 mm, and the height of each terminal 170 once connected to a main board is about 0.4 mm. The dam 115 is thus preferably about 0.2 mm high and the height of a bonding wire above the circuit substrate is preferably 0.1 mm or less.

Figure 4:
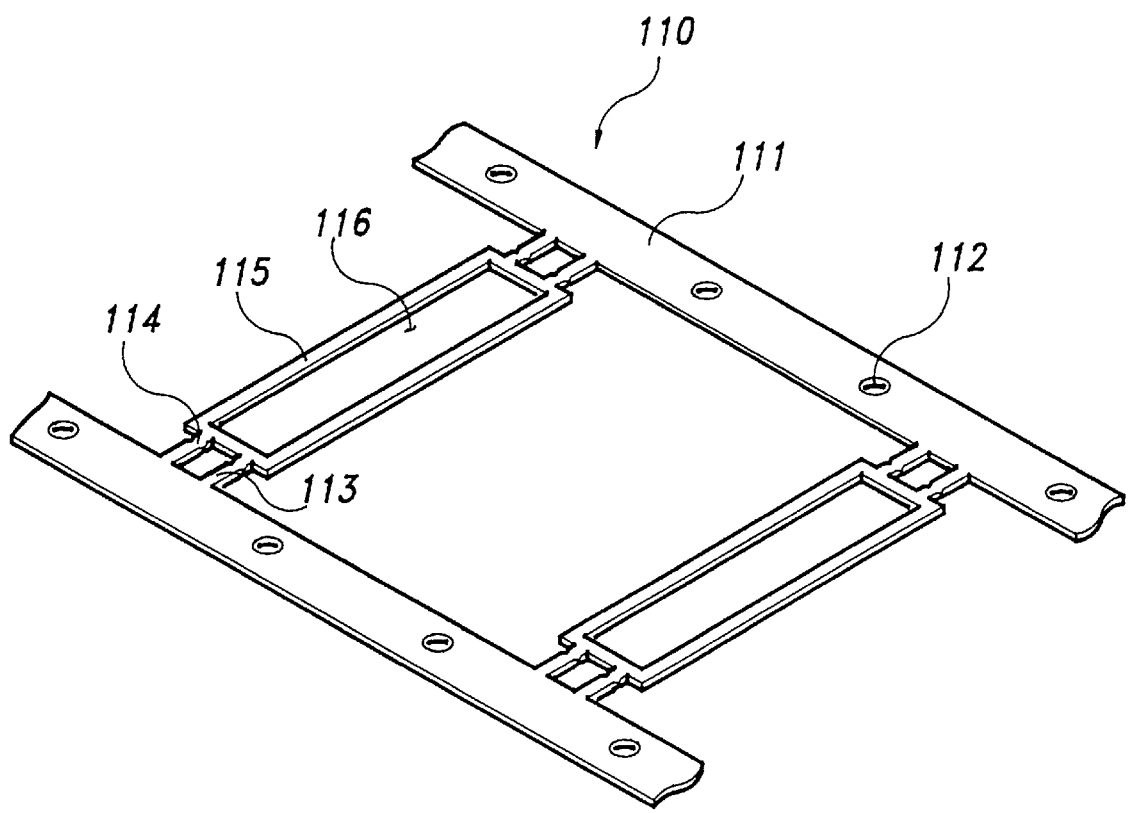
FIGS. 4–10 are perspective views illustrating steps of a method for fabricating the semiconductor chip assembly of FIGS. 2 and 3.

FIGS. 4 through 10 illustrate steps of a method for forming the chip-scale assembly 100 of FIGS. 2 and 3. With reference to FIG. 4, a dam carrier 110 is prepared. The dam carrier 110 is preferably formed as a continuous strip similar to a leadframe for a plastic package. The dam carrier 110 has two parallel guide rails 111 on opposite sides of each dam, and the dams 115 are linked to the guide rails 111 by tie bars 113.

The dam carrier 110 can be made from a rigid material such as a metal, and the dam carrier can be formed using stamping or etching techniques. Guide holes 112 and the guide rails 111 facilitate continuous production. The tie bars 113 link the dams 115 to the guide rails 111, and the dams 115 preferably have a rectangular ring shape to define the window 116. Each tie bar 113 preferably has at least one notch 114 which aids in the separation of individual packages when the manufacturing steps have been completed. The semiconductor chip and the circuit substrate discussed above with regard to FIGS. 2 and 3 may be prepared separately.

Figure 5:
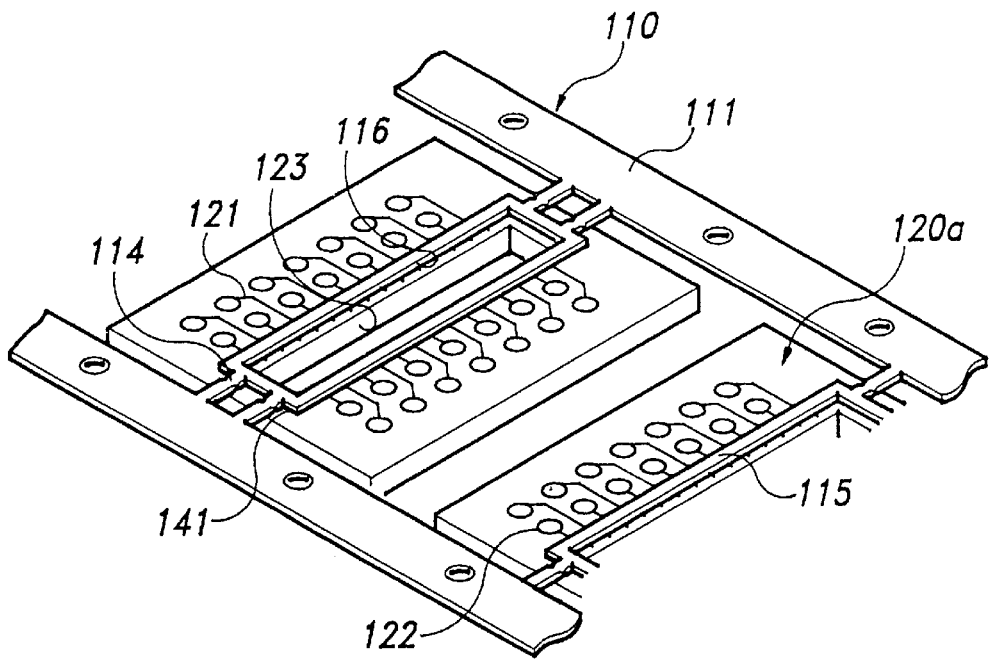

As shown in FIG. 5, the circuit substrate 120a is attached to the dam 115 of the dam carrier 110. The circuit substrate 120a includes conductive traces 121 and land pads 122 which are formed on a top surface thereof. The circuit substrate also includes an opening 123 which extends through an interior portion of the circuit substrate 120a. The opening 123 is preferably smaller than the window 116 of the dam carrier 110. Portions of the conductive traces 121 are thus exposed through the window 116, and these exposed portions adjacent the opening can be used for wire bonding.

Figure 7:
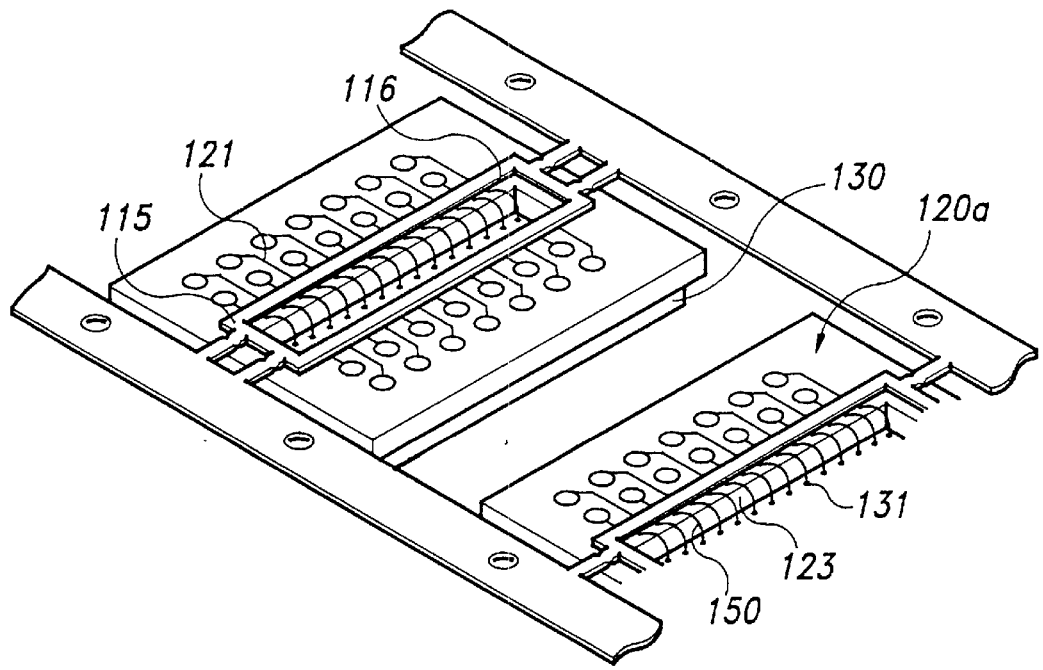

The exposed portions of the conductive traces 121 adjacent the opening 123 can be connected with the semiconductor chip 130 as discussed below with regard to FIG. 7. The length of the long side of the circuit substrate 120a is preferably smaller than the distance between the two guide rails 111, and greater than the distance between the notches 114 which are provided at opposing sides of the dam 115. The notches 114 are thus positioned over the circuit substrate 120a preventing the remaining portion 113a of the tie bar from touching and affecting other devices when the package 100 is mounted on a main board. The adhesive 141 is an electrically non-conductive material.

Figure 6:
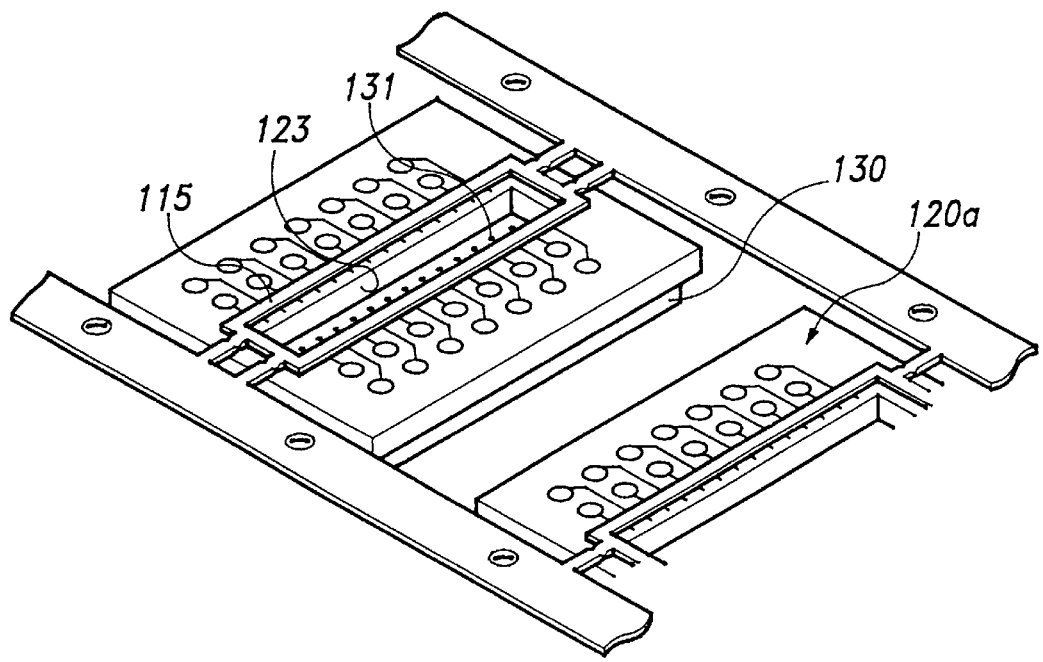

The step of attaching the integrated circuit chip 130 to the circuit substrate 120a is shown in FIG. 6. The semiconductor chip 130 is attached to the bottom surface of the circuit substrate 120a opposite the dam and the conductive traces. The semiconductor chip 130 has a plurality of chip pads 131 formed on an interior portion of the surface thereof. The chip pads 131 are thus exposed by the opening 123 of the circuit substrate, and an electrically non-conductive adhesive 142 is used to attach the semiconductor chip to the circuit substrate. The chip pads 131 are exposed to the opening 123, and wire bonding portions of the conductive traces 121 are exposed to the window 116 adjacent the opening 123. Accordingly, bonding wires can be used to connect the chip pads 131 and the conductive traces 121 as shown in FIG. 7. In particular, the bonding wires 150 can be gold or aluminum wires.

Figure 8:
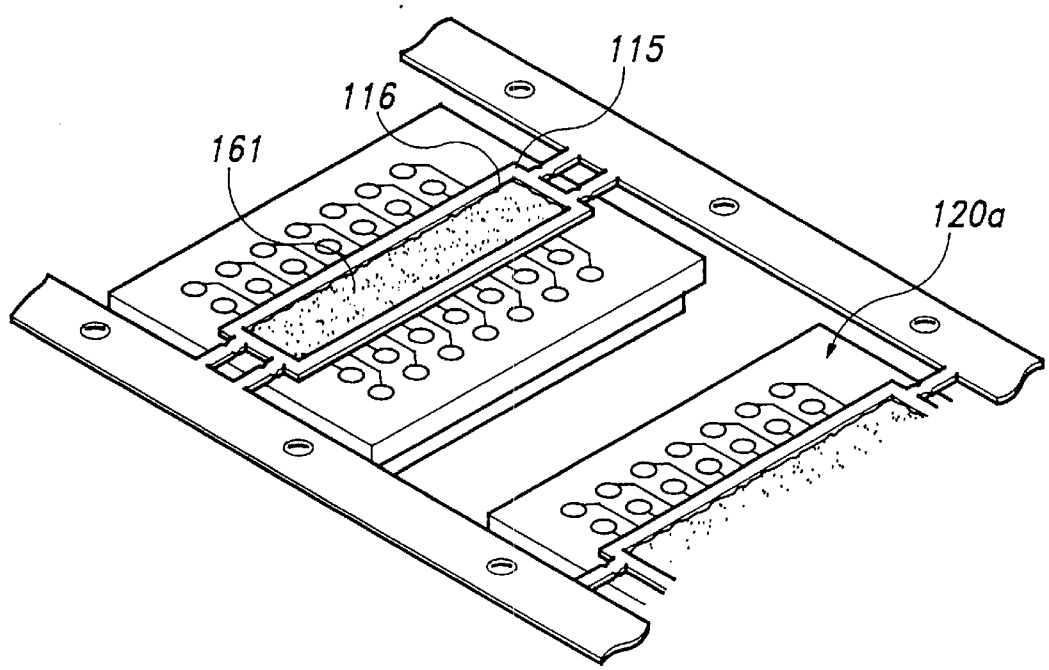

The bonding wires 150 can be covered with an encapsulant 161 such as a potting resin as shown in FIG. 8. For example, a potting resin such as an epoxy resin similar to that used in a plastic package can be used. The encapsulant can be provided by screen printing or other techniques, and the dam 115 can prevent the potting resin from overflowing onto other portions of the circuit substrate 120a. The dam thus enables the potting resin to maintain a desired height below that of the dam 115. In particular, the dam enables the potting resin to be formed to a predetermined height above the bonding wires without spreading across the surface of the circuit substrate.

Figure 9:
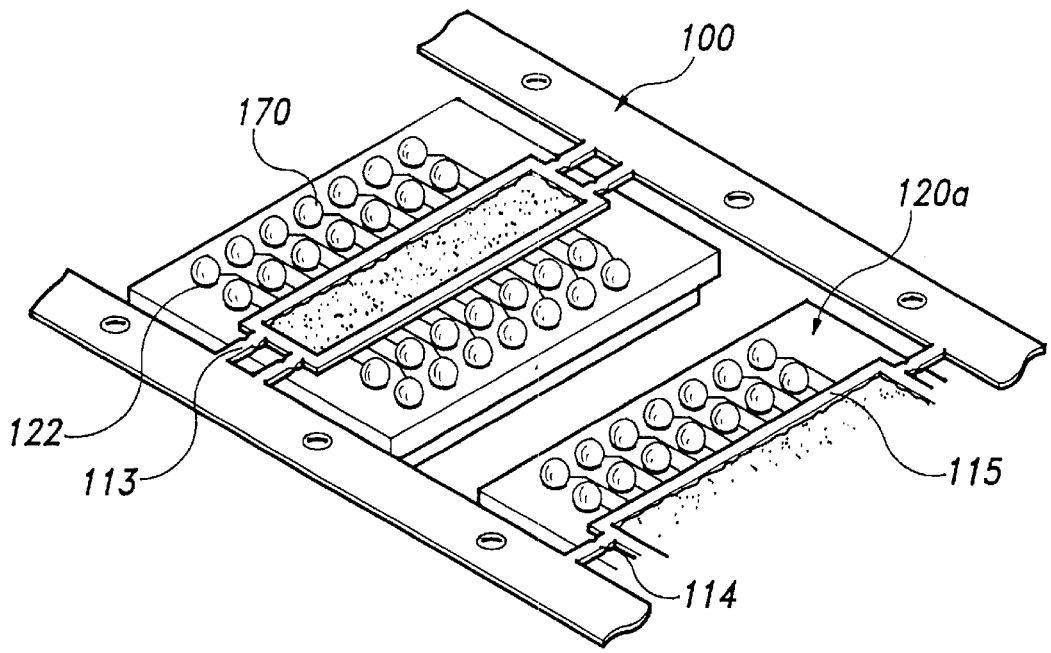

The step of forming the terminals 170 on the circuit substrate 120a is illustrated in FIG. 9. The terminals 170 can be solder balls or other electrically conductive materials, and these terminals are formed on the land pads 122. Accordingly, the terminals 170 are physically and electrically connected with the land pads 122. In particular, the terminals 170 preferably have a height greater than that of solder dam 115. Solder balls may be formed using solder mounting or reflow methods known to those having skill in the art. Other electrically conductive materials used to form the terminals 170 can include Au/Sn, Cu/Au/Sn, or other similar layered structures, and these structures can be formed by metal plating or screen printing techniques. The dam carrier 110 allows the terminals 170 to be formed using conventional techniques. Alternately, the terminals can be formed on the circuit substrate prior to joining with the dam.

Figure 10:
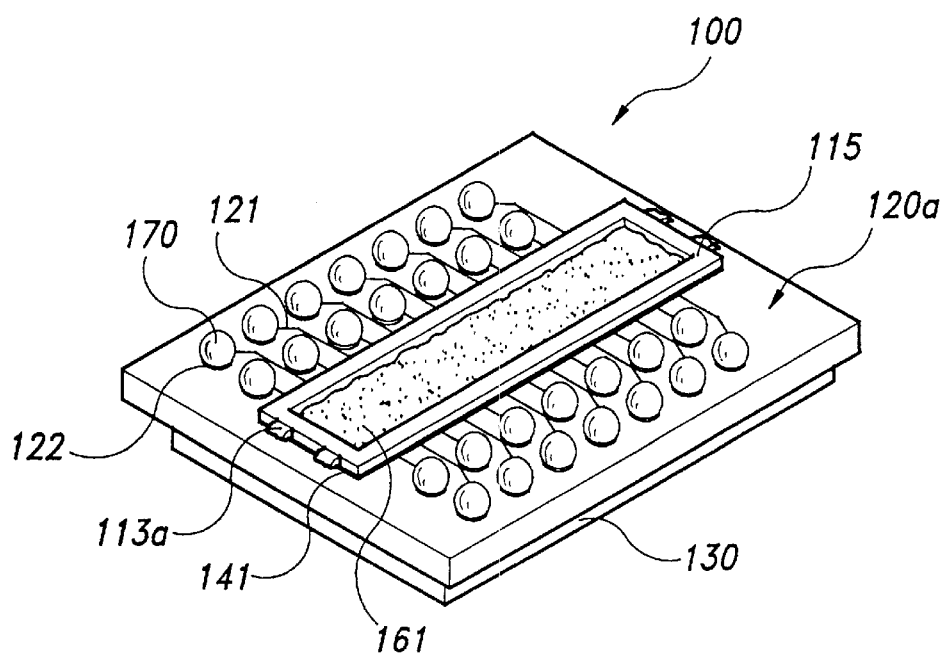

The packages can then be separated into individual packages 100 as shown in FIG. 10. The separation can be achieved by cutting the tie bars 113 from the dam 115. The notch 114 on each tie bar 113 can facilitate separation. In particular, the notch 114 allows the separation to occur at the notch upon application of a relatively slight pressure.

Figure 11:
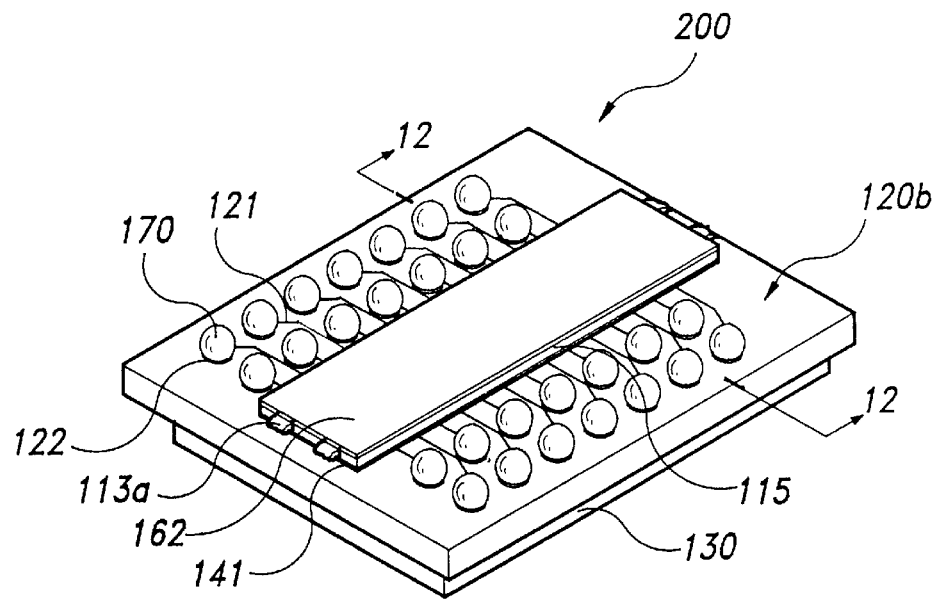
FIG. 11 is a perspective view illustrating a second semiconductor chip assembly according to the present invention.
Figure 12:
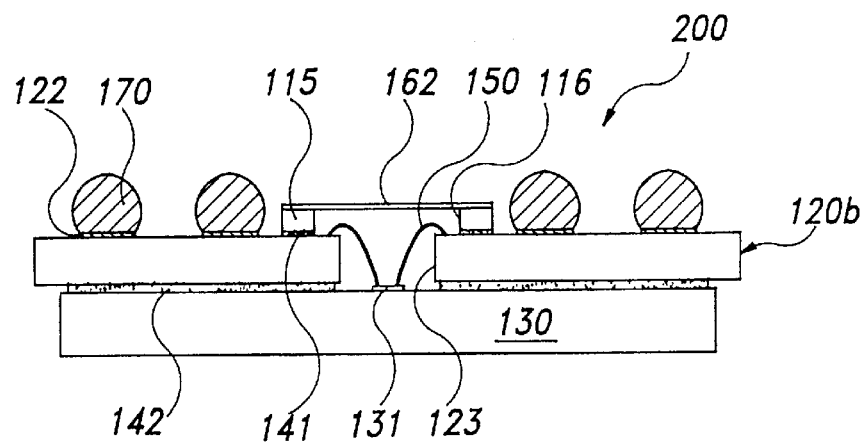
FIG. 12 is a cross-sectional view taken along section line 12—12 of FIG. 11.

FIG. 11 illustrates a second semiconductor chip assembly 200 according to the present invention, and FIG. 12 is a cross-sectional view taken along section line 12—12 of FIG. 11. Because FIGS. 11 and 12 correspond to FIGS. 2 and 3, common elements are designated by common reference numbers. Accordingly, these common elements will not be discussed in detail, and the following discussion will relate primarily to the differences therebetween.

In FIGS. 11 and 12, the bonding wires are encapsulated with a sealing lid 162 which is mounted on the dam 115. As shown, the window 116 defined by the dam 115 is covered by the sealing lid 162. In particular, the top surface of the sealing lid 162 has a height after mounting that is less than the height of the terminals 170.

In a method for forming the package of FIGS. 11 and 12 illustrated in FIGS. 13–18, the terminals are formed on the circuit substrate before attachment to the dam 115. In the method discussed with reference to FIGS. 3–10, the terminals were not formed until after assembling the semiconductor chip, the circuit substrate, and the dam. One having skill in the art, however, will understand that the terminals can be formed on the circuit substrate before or after assembly in either the method discussed with reference to FIGS. 3–10 or the method discussed with reference to FIGS. 13–18.

Figure 13:
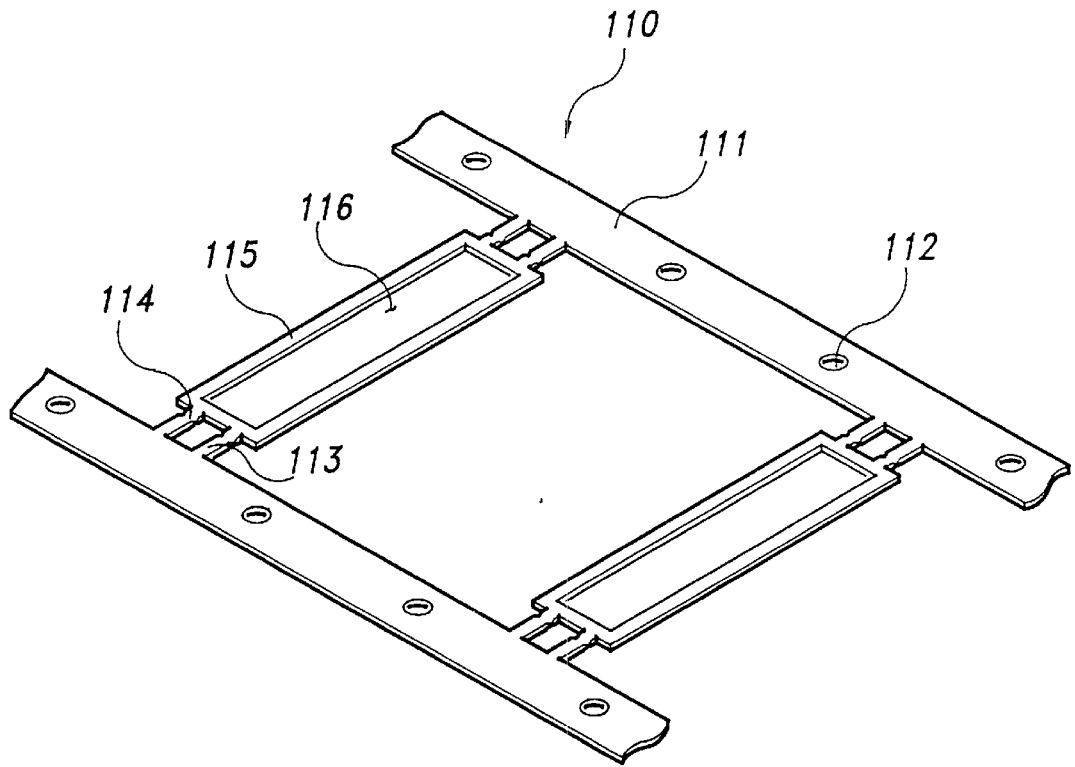
FIGS. 13–18 are perspective views illustrating steps of a method for fabricating the semiconductor chip assembly of FIGS. 11 and 12.
Figure 14:
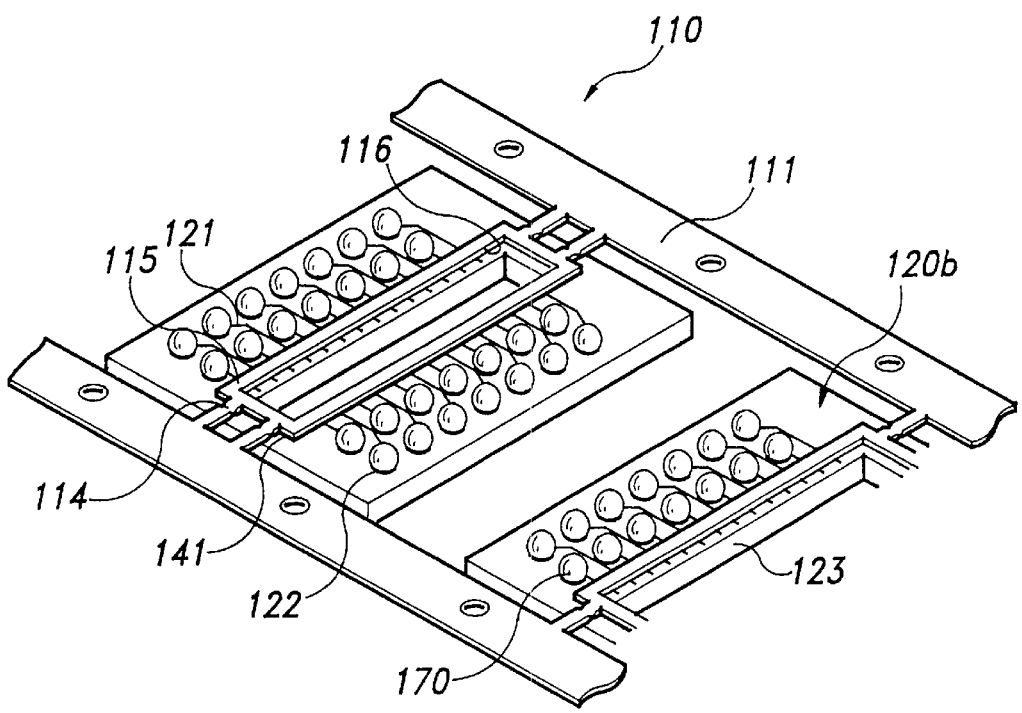

FIGS. 13 through 18 illustrate steps of a method for forming the chip-scale semiconductor chip assembly 200 of FIGS. 11 and 12. As discussed above with reference to FIG. 4, the dam carrier 110 is prepared as shown in FIG. 13. In addition, the semiconductor chip and the circuit substrate can be simultaneously prepared. The circuit substrate 120b is attached to the dam 115 of the dam carrier 110 as shown in FIG. 14. As shown, the terminals 170 have been previously formed on the circuit substrate 120b. Alternately, the terminals 170 can be formed at later steps in the method such as after the bonding wires have been encapsulated.

Figure 15:
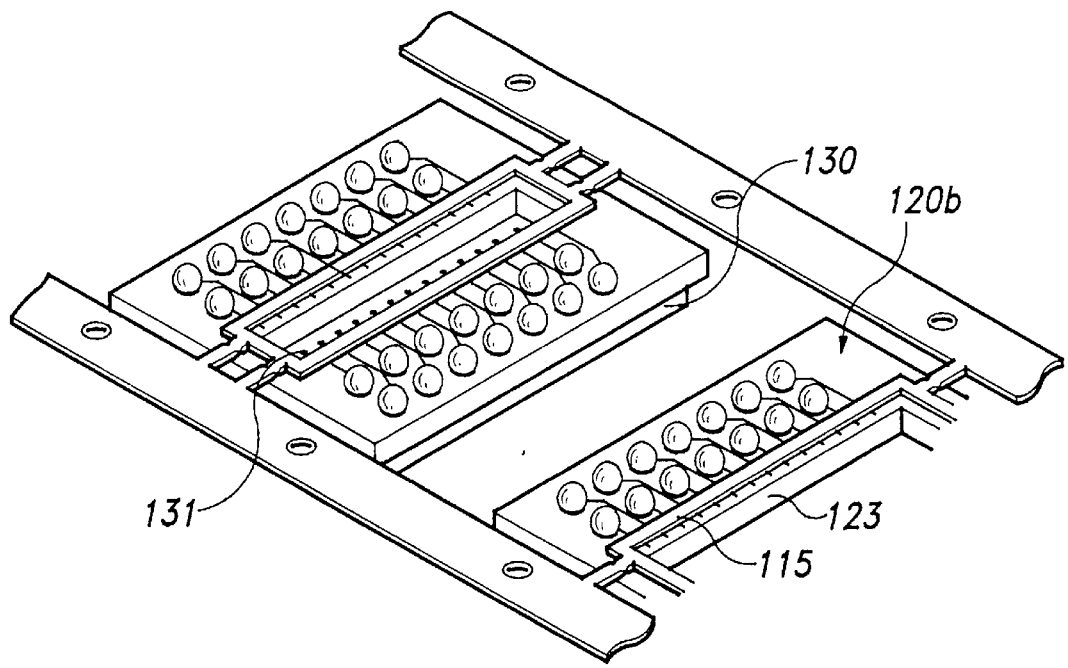
Figure 16:
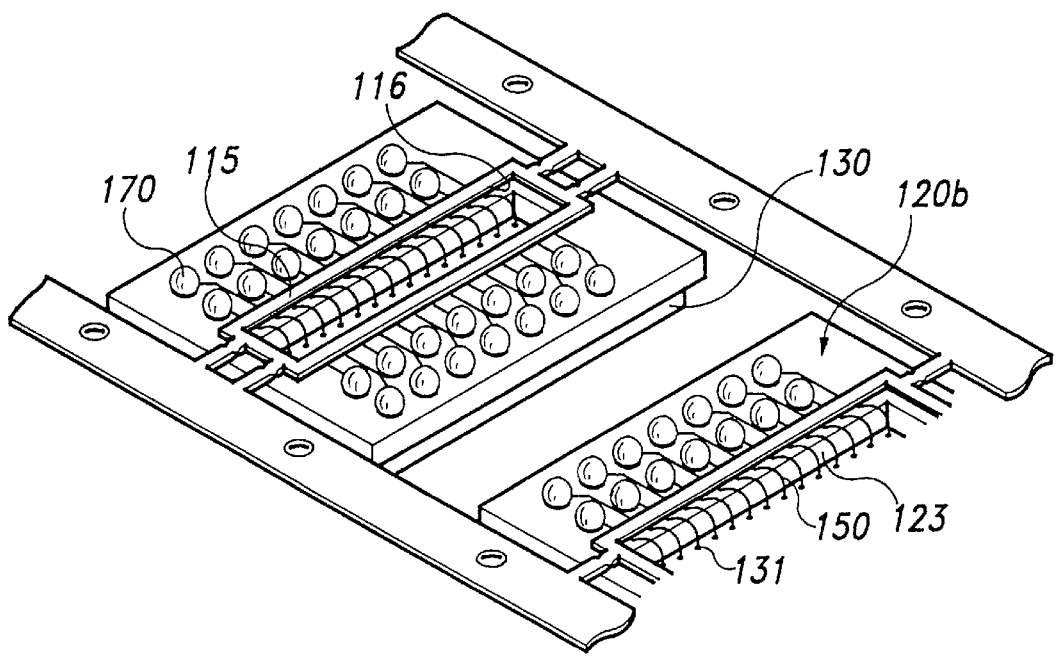
Figure 17:
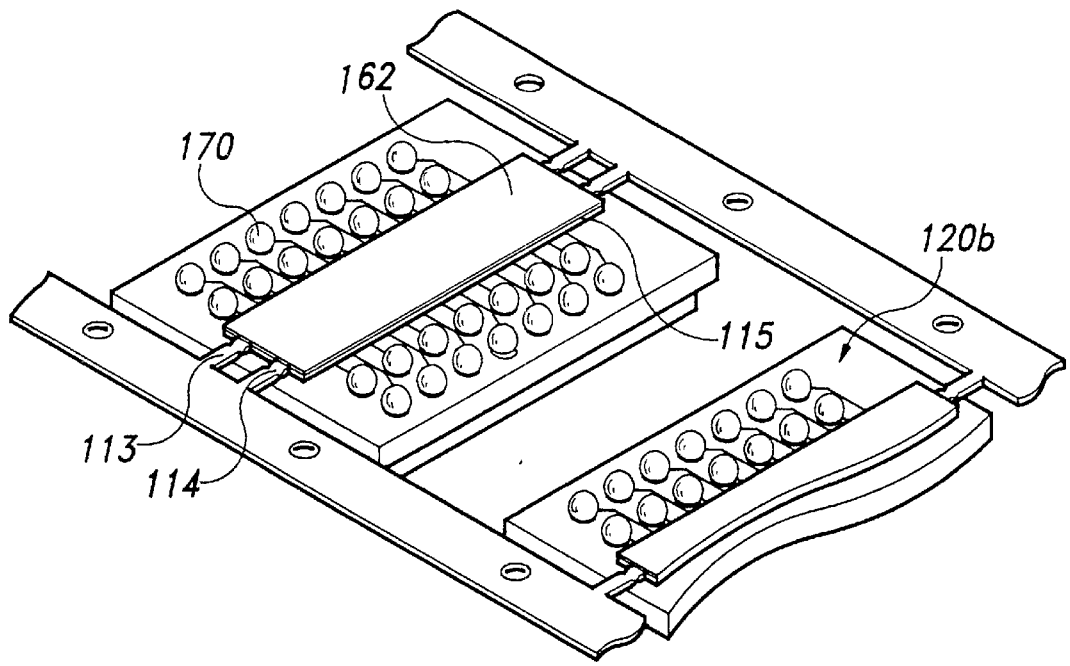
Figure 18:
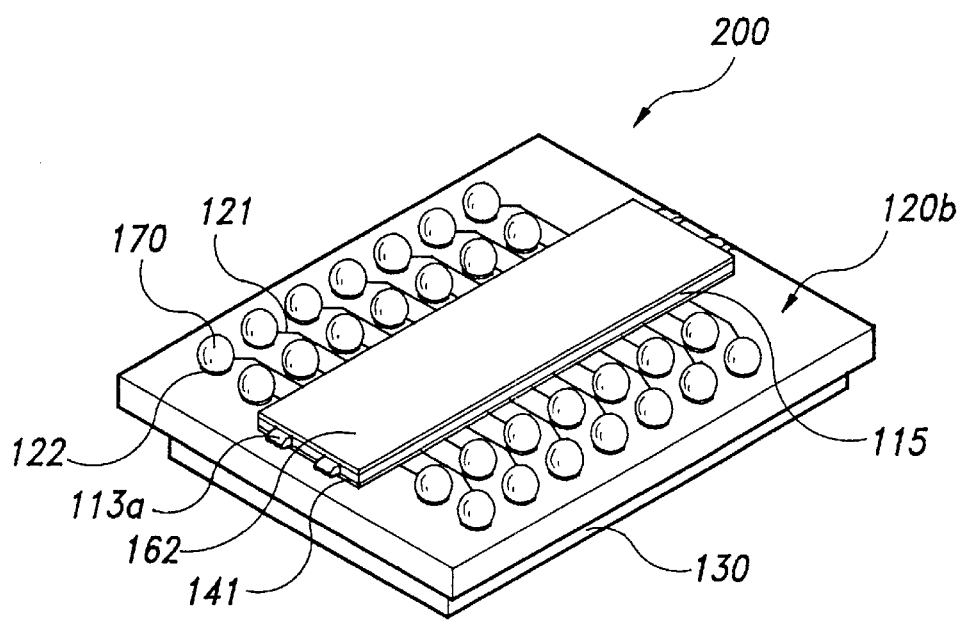

The steps of attaching the semiconductor chip 130 to the circuit substrate 120b and electrically connecting the semiconductor chip 130 to the circuit substrate 120b are illustrated in FIGS. 15 and 16. In particular, chip pads 131 are electrically connected to respective conductive traces 121 by bonding wires 150. The window 116 of the dam and the opening 123 of the circuit substrate are encapsulated with a sealing lid 162 as shown in FIG. 17. The sealing lid 162 is attached to the dam 115 using an adhesive such as an epoxy. The sealing lid 162 can be made from a layer of plastic, glass, or metal, and the top surface of the sealing lid 162 is preferably lower than the top surface of the terminals 170. The tie bars can be cut away from each dam 115 so that each assembly is separated into an individual assembly 200 as shown in FIG. 18.

The semiconductor chip assemblies discussed above including wire bonding interconnections, printed circuit substrates, and dam carriers can thus be fabricated at a relatively low cost. The dam facilitates the encapsulation of the bonding wires using a potting resin by confining the potting resin within a window defined thereby. In particular, the dam prevents the potting resin from overflowing and enables the potting resin to be filled in the window to a height less than that of the dam. When using a sealing lid to encapsulate the bonding wires, the dam mechanically supports the sealing lid above the bonding wires. Furthermore, the notch in the tie bars allows completed packages to be separated from the dam carrier by application of a relatively slight pressure to break the tie bars at the notches.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor chip assembly comprising:
a semiconductor chip including a plurality of input/output pads on a surface thereof wherein said input/output pads are on an interior portion of said surface of said semiconductor chip;
an insulating layer on said surface of said semiconductor chip wherein said input/output pads are exposed adjacent said insulating layer wherein said insulating layer has an opening therein exposing said input/output pads;
a plurality of conductive traces on said insulating layer opposite said semiconductor chip wherein each of said conductive traces corresponds to a respective one of said input/output pads;
a plurality of bonding wires wherein each of said bonding wires corresponds to a respective one of said input/output pads and one of said conductive traces, and wherein each of said bonding wires is bonded at a first end to said respective input/output pad and at a second end to said respective conductive trace;
a dam on said insulating layer opposite said semiconductor chip and around said opening wherein each of said conductive traces extends under said dam to a portion of said insulating layer outside said dam;
a sealing lid on said dam wherein said sealing lid covers said opening, said bonding wires, and said input/output pads;
at least one tie bar extending from said dam; and
a rail connected to said tie bar.

2. A semiconductor chip assembly according to claim 1 further comprising:
a plurality of terminals on said insulating layer outside said dam wherein each of said terminals is electrically connected to a respective one of said conductive traces, wherein each of said terminals extends a first predetermined distance from said insulating layer, wherein said dam extends a second predetermined distance from said insulating layer, and wherein said first predetermined distance is greater than said second predetermined distance.

3. A semiconductor chip assembly according to claim 1 wherein said dam comprises a rectangular dam surrounding said opening.

4. A semiconductor chip assembly according to claim 1 wherein said dam, said at least one tie bar, and said rail are formed from a single layer of a material.

5. A semiconductor chip assembly according to claim 4 wherein said at least one tie bar includes a notch adjacent said dam.

6. A semiconductor chip assembly comprising:
   a semiconductor chip including a plurality of input/output pads on an interior portion of a surface thereof;
   an insulating layer on said surface of said semiconductor chip wherein said insulating layer has an opening therein exposing said input/output pads;
   a plurality of conductive traces on said insulating layer opposite said semiconductor chip wherein each of said conductive traces corresponds to a respective one of said input/output pads;
   a dam on said insulating layer opposite said semiconductor chip and around said opening wherein each of said conductive traces extends under said dam to a portion of said insulating layer outside said dam;
   a plurality of bonding wires wherein each of said bonding wires corresponds to a respective one of said input/output pads and one of said conductive traces, and wherein each of said bonding wires is bonded at a first end to said respective input/output pad and at a second end to said respective conductive trace;
   a sealing lid on said dam wherein said sealing lid covers said opening, said bonding wires, and said input/output pads;
   at least one tie bar extending from said dam; and
   a rail connected to said tie bar.

7. A semiconductor chip assembly according to claim 6 further comprising:
   a plurality of terminals on said insulating layer outside said dam wherein each of said terminals is electrically connected to a respective one of said conductive traces, wherein each of said terminals extends a first predetermined distance from said insulating layer, wherein said dam extends a second predetermined distance from said insulating layer, and wherein said first predetermined distance is greater than said second predetermined distance.

8. A semiconductor chip assembly according to claim 6 wherein said dam comprises a rectangular dam surrounding said opening.

9. A semiconductor chip assembly according to claim 6 wherein said dam, said at least one tie bar, and said rail are formed from a single layer of a material.

10. A semiconductor chip assembly according to claim 9 wherein said at least one tie bar includes a notch adjacent said dam.

11. An intermediate package for a semiconductor chip including a plurality of input/output pads on an interior portion of a surface thereof, said intermediate package comprising:
    an insulating layer including a first surface for bonding with the surface of the semiconductor chip wherein said insulating layer has an opening therein for exposing the input/output pads;
    a plurality of conductive traces on a second surface of said insulating layer opposite said first surface wherein each of said conductive traces corresponds to a respective one of the input/output pads;
    a dam on said second surface of said insulating layer around said opening wherein each of said conductive traces extends from adjacent said opening under said dam to a portion of said insulating layer outside said dam;
    at least one tie bar extending from said dam; and
    a rail connected to said tie bar wherein said dam, said at least one tie bar, and said rail are formed from a single layer of a material.

12. An intermediate package according to claim 11 wherein said conductive traces are adapted to receive a plurality of bonding wires each of which corresponds to a respective one of the input/output pads, so that each of said bonding wires can be bonded at a first end to the respective input/output pad and at a second end to said respective conductive trace.

13. An intermediate package according to claim 1 further comprising:
    a plurality of terminals on said insulating layer outside said dam wherein each of said terminals is electrically connected to a respective one of said conductive traces, wherein each of said terminals extends a first predetermined distance from said insulating layer, wherein said dam extends a second predetermined distance from said insulating layer, and wherein said first predetermined distance is greater than said second predetermined distance.

14. An intermediate package according to claim 11 wherein said dam comprises a rectangular dam surrounding said opening.

15. An intermediate package according to claim 11 wherein said at least one tie bar includes a notch adjacent said dam.

16. An intermediate semiconductor chip assembly comprising:
    a semiconductor chip including a plurality of input/output pads on an interior portion of a surface thereof;
    an insulating layer on said surface of said semiconductor chip wherein said insulating layer has an opening therein exposing said input/output pads;
    a plurality of conductive traces on said insulating layer opposite said semiconductor chip wherein each of said conductive traces corresponds to a respective one of said input/output pads; and
    a dam on said insulating layer opposite said semiconductor chip and around said opening wherein each of said conductive traces extends under said dam to a portion of said insulating layer outside said dam;
    at least one tie bar extending from said dam; and
    a rail connected to said tie bar wherein said dam, said at least one tie bar, and said rail are formed from a single layer of a material.

17. An intermediate semiconductor chip assembly according to claim 16 further comprising:
    a plurality of bonding wires wherein each of said bonding wires corresponds to a respective one of said input/output pads and one of said conductive traces, and wherein each of said bonding wires is bonded at a first end to said respective input/output pad and at a second end to said respective conductive trace.

18. An intermediate semiconductor chip assembly according to claim 17 further comprising:

an encapsulant on said input/output pads, on said bonding wires, and on portions of said conductive traces inside said dam.

19. An intermediate semiconductor chip assembly according to claim 18 wherein said dam defines a window exposing said opening of said insulating layer and wherein said encapsulant is contained in said opening and in said window.

20. An intermediate semiconductor chip assembly according to claim 18 wherein said dam extends a first predetermined distance from said insulating layer, wherein said encapsulant extends a second predetermined distance from said insulating layer, and wherein said first distance is greater than said second distance.

21. An intermediate semiconductor chip assembly according to claim 18 wherein said encapsulant comprises a potting resin.

22. An intermediate semiconductor chip assembly according to claim 16 further comprising:

a plurality of terminals on said insulating layer outside said dam wherein each of said terminals is electrically connected to a respective one of said conductive traces, wherein each of said terminals extends a first predetermined distance from said insulating layer, wherein said dam extends a second predetermined distance from said insulating layer, and wherein said first predetermined distance is greater than said second predetermined distance.

23. An intermediate semiconductor chip assembly according to claim 16 wherein said dam comprises a rectangular dam surrounding said opening.

24. An intermediate semiconductor chip assembly according to claim 17 further comprising:

a sealing lid on said dam wherein said sealing lid covers said opening, said bonding wires, and said input/output pads.

25. An intermediate semiconductor chip assembly according to claim 16 wherein said at least one tie bar includes a notch adjacent said dam.

* * * * *

UNITED STATES PATENT AND TRADEMARK OFFICE
CERTIFICATE OF CORRECTION

PATENT NO. : 6,013,946
DATED : January 11, 2000
INVENTOR(S) : Kyu Jin Lee; Do Soo Jeong & Jae June Kim It is certified that error appears in the above-identified patent and that said Letters Patent is hereby corrected as shown below:

Title Page,
Item [54] and column 1, in the title should read as follows:
--WIRE BOND PACKAGES FOR SEMICONDUCTOR CHIPS AND RELATED ASSEMBLIES--

Claim 13, column 10,
Line 23 correct the dependency of claim 13 by deleting "claim 1" and replacing -- claim 11 --therefor.

Signed and Sealed this

Third Day of July, 2001

Attest:

NICHOLAS P. GODICI
Attesting Officer    Acting Director of the United States Patent and Trademark Office